(12) United States Patent
Yeom et al.

(10) Patent No.: US 11,445,624 B2
(45) Date of Patent: Sep. 13, 2022

(54) APPARATUS AND METHOD FOR DETECTING DISASSEMBLY OF APPARATUS

(71) Applicant: Suprema Inc., Gyeonggi-do (KR)

(72) Inventors: Junsun Yeom, Gyeonggi-do (KR); Taehoon Lee, Gyeonggi-do (KR)

(73) Assignee: SUPREMA INC., Gyeonggi-Do (KR)

( * ) Notice: Subject to any disclaimer, the term of this patent is extended or adjusted under 35 U.S.C. 154(b) by 9 days.

(21) Appl. No.: 17/237,286

(22) Filed: Apr. 22, 2021

(65) Prior Publication Data
US 2021/0337680 A1    Oct. 28, 2021

(30) Foreign Application Priority Data

Apr. 24, 2020    (KR) .................. 10-2020-0050119

(51) Int. Cl.
*H05K 5/02*    (2006.01)
*G06V 40/13*    (2022.01)

(52) U.S. Cl.
CPC ........... *H05K 5/0208* (2013.01); *G06V 40/13* (2022.01)

(58) Field of Classification Search
None
See application file for complete search history.

(56) References Cited

U.S. PATENT DOCUMENTS 10,362,694 B1 *   7/2019   Lee .................. H05K 5/0008

FOREIGN PATENT DOCUMENTS

| JP | 2002-257862 A | 9/2002 |
|---|---|---|
| KR | 10-2019-0046031 A | 5/2019 |
| KR | 10-2019603 B1 | 9/2019 |

* cited by examiner

*Primary Examiner* — Nicholas J Lee
(74) *Attorney, Agent, or Firm* — Maier & Maier, PLLC

(57) ABSTRACT

An apparatus has a device installed on an entrance wall bracket. The apparatus includes a fixing member configured to fix the device to the entrance wall bracket, a detection switch selectively pushed by the fixing member to detect whether the fixing member is released, and a tamper unit operating a tamper function when the release of the fixing member is detected through the detection switch.

15 Claims, 4 Drawing Sheets

APPARATUS AND METHOD FOR DETECTING DISASSEMBLY OF APPARATUS

CROSS-REFERENCE TO RELATED APPLICATIONS

This application is based on and claims priority from Korean Patent Application No. 10-2020-0050119, filed on Apr. 24, 2020, the disclosure of which is incorporated herein in its entirety by reference for all purposes.

FIELD

The present disclosure relates to an apparatus and a method for detecting a disassembly of the apparatus, and more particularly, to an apparatus and a method capable of quickly detecting illegal disassembly of the apparatus.

BACKGROUND

In general, a device, for example, a fingerprint recognition device includes a housing constituting an exterior, a prism mounted on the housing, a light source, a lens system, an image sensor, and a printed circuit having a controller.

In the fingerprint recognition device, when a fingerprint area of a finger is pushed to a fingerprint collection surface of the prism, light from the light source is reflected and absorbed from valleys and ridges of the fingerprint, the reflected light enters the prism to form an image on the lens system, and the imaged light on the lens system is detected through the image sensor. The fingerprint detected through the image sensor is sent to an image processor, and the image processor recognizes whether or not the detected fingerprint is a registered fingerprint by comparing the detected fingerprint with the registered fingerprint.

However, when the fingerprint recognition device is arbitrarily disassembled by an unauthorized outsider, important data stored in the fingerprint recognition device as well as information on a main design of the fingerprint recognition device may be tampered with using hardware or software.

SUMMARY

In view of the above, the present disclosure provides an apparatus and a method capable of quickly detecting illegal disassembly by an unauthorized outsider and coping with the illegal disassembly.

In accordance with a first aspect of the present disclosure, there is provided an apparatus having a device installed on an entrance wall bracket, including: a fixing member configured to fix the device to the entrance wall bracket; a detection switch pushed by the fixing member to detect whether the fixing member is released; and a tamper unit operating a tamper function when the release of the fixing member is detected through the detection switch.

The fixing member may have a tip portion and the device may include a fixing hole, and the apparatus may further include an insert mounted in the fixing hole through which the tip portion of the fixing member is rotatably coupled.

The apparatus may further include a cap sealing member having elasticity and provided between the tip portion of the fixing member and detection switch.

The detection switch may include a tact switch configured to turn off a tamper function of the tamper unit when the tact switch is pushed in a predetermined distance by a tip portion of the fixing member and turn on the tamper function of the tamper unit when the tact switch is pushed in a distance less than the predetermined distance by the tip portion of the fixing member or is separated from the tip portion of the fixing member.

The detection switch may include: a terminal electrically connected to a printed circuit board; a button configured to apply an operation signal by the push of the fixing member; and a tamper body configured to transmit the operation signal of the button to the terminal and elastically supporting the button, wherein the button may extend from the tamper body in a first direction in which the button faces the tip portion of the fixing member, and the terminal may be disposed in a second direction perpendicular to the first direction to face the printed circuit board.

The cap sealing member may include: a cover portion positioned to face the fixing hole and formed convexly in a direction in which the fixing member is inserted; and a fixing portion extending outward from the cover portion to be fixed to an edge of the fixing hole.

The cap sealing member may include: a cover portion positioned to face the fixing hole and formed convexly in a direction in which the fixing member is inserted; a fixing portion fixed to an edge of the fixing hole; and a corrugated portion provided between the cover portion and the fixing portion to connect the cover portion and the fixing portion, wherein the corrugated portion is extended and contracted by the push of the fixing member.

The tamper unit may generate an alarm signal to implement the tamper function.

In accordance with a second aspect of the present disclosure, there is provided an apparatus including: an entrance wall bracket having a through hole and configured to be fixedly installed on an entrance wall; and a device installed on the entrance wall bracket, wherein the device may include: a fixing member configured to fix the device to the entrance wall bracket; a detection switch selectively pushed by the fixing member to detect whether the fixing member is released; and a tamper unit operating a tamper function when the release of the fixing member is detected through the detection switch.

The device may include a fixing hole to match the through hole when the device is assembled to the entrance wall bracket.

The device may be configured to be fastened to the entrance wall bracket by one fixing member.

In accordance with a second aspect of the present disclosure, there is provided a method of detecting disassembly of an apparatus, including: providing an apparatus including: an entrance wall bracket having a through hole and configured to be fixedly installed on an entrance wall; and a device installed on the entrance wall bracket; detecting whether a fixing member is released using a detection switch pushed by the fixing member; and operating a tamper function.

The detection switch may detect that the fixing member is released when the detection switch becomes not to be pushed by the fixing member.

In the providing the apparatus, the device may include a fixing hole to match the through hole when the device is assembled to the entrance wall bracket.

In the providing the apparatus, the device may be fastened to the entrance wall bracket by one fixing member.

Effects of the fingerprint recognition apparatus according to the present disclosure will be described as follows.

According to embodiments of the present disclosure, it is possible to quickly detect separation of the fixing member by an unauthorized outsider (competitor, other companies, or the like) through the detection switch that detects a push release of the fixing member (for example, a screw). Therefore, it is possible to strengthen a tamper operation of device and prevent falsification of important design information and important data of the device by the unauthorized outsider in advance.

In addition, according to embodiments of the present disclosure, by disposing the cap sealing member between the tip portion of the fixing member and the detection switch, it is possible to prevent a leakage through the fixing hole of the device into which the fixing member is inserted in advance.

DETAILED DESCRIPTION OF THE EMBODIMENTS

Hereinafter, specific embodiments for implementing a spirit of the present disclosure will be described in detail with reference to the drawings.

In addition, in describing the present disclosure, when it is determined that a detailed description of a related known configuration or function may obscure the subject matter of the present disclosure, a detailed description thereof will be omitted. Moreover, in the following description, an up-down direction is described based on a state illustrated in FIGS. 1 to 3 for the convenience of explanation, and a position of each component is not limited by description of a direction.

Figure 1:
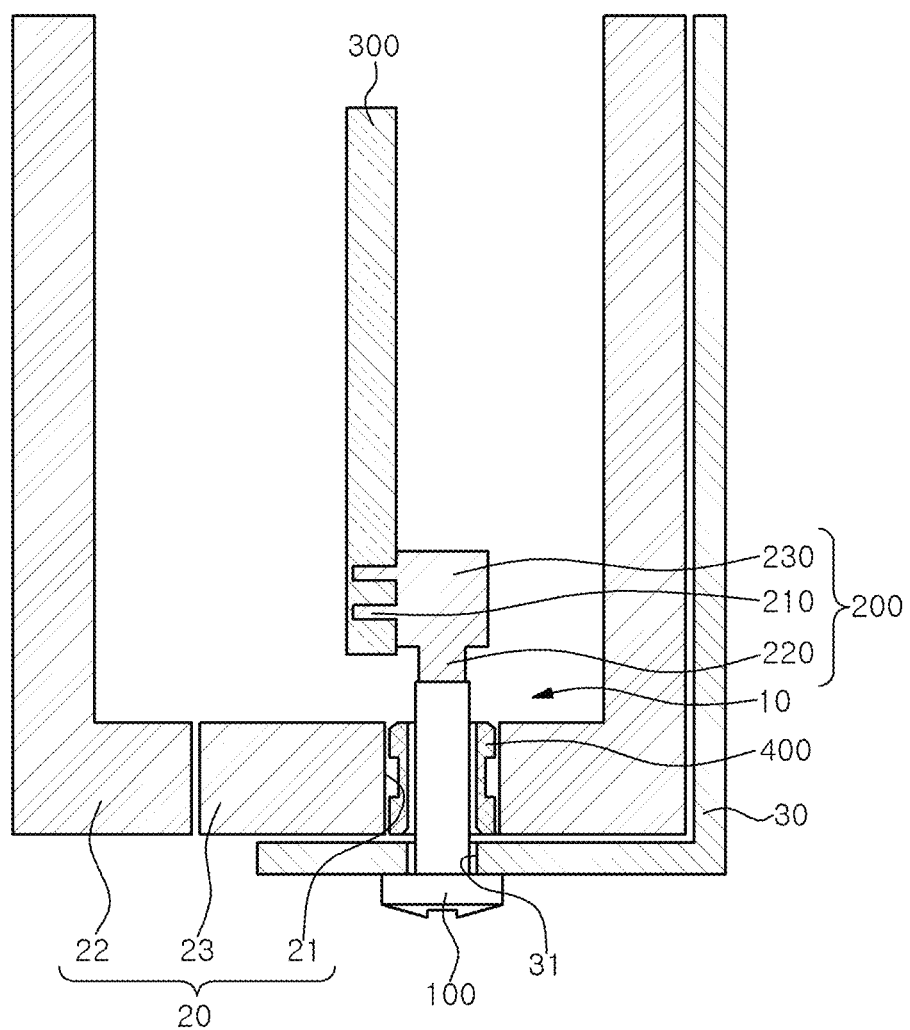
FIG. 1 is a configuration diagram illustrating an apparatus according to a first embodiment of the present disclosure.
Figure 2:
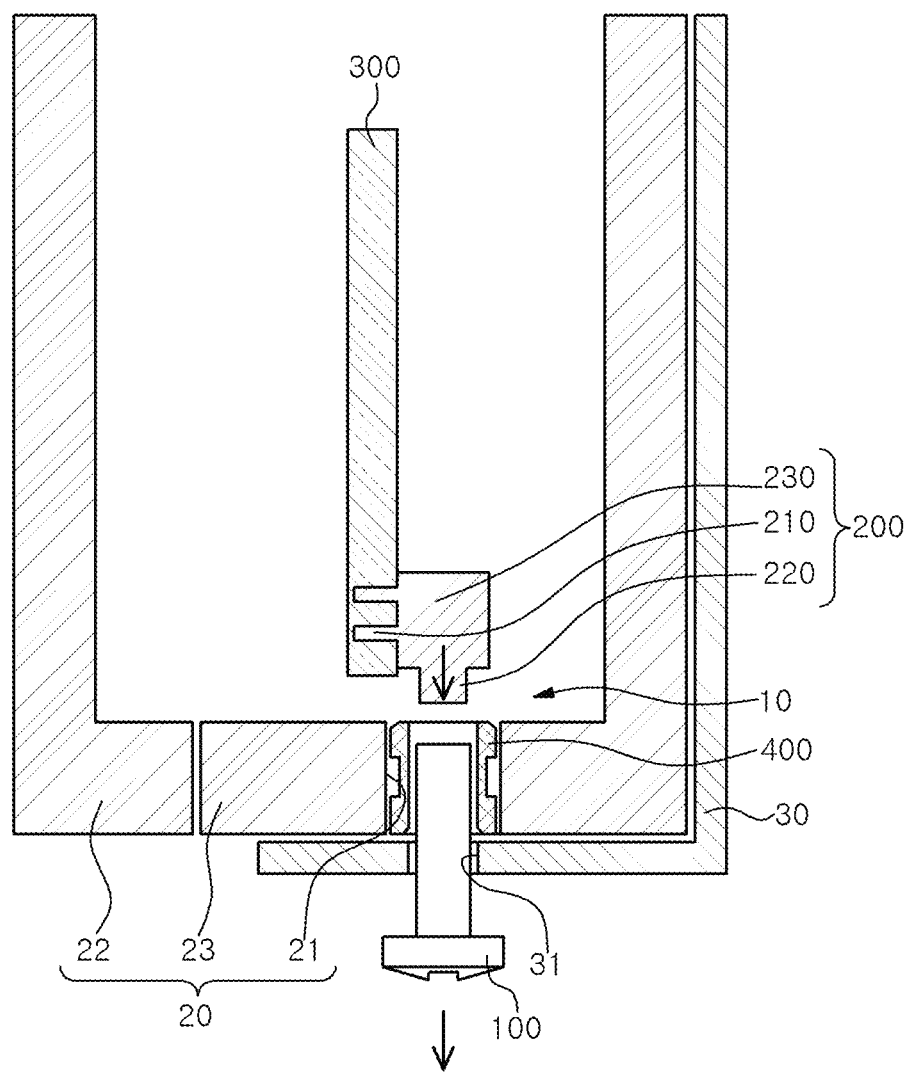
FIG. 2 is a state diagram illustrating a state in which a push of a fixing member with respect to a detection switch is released when the fixing member is separated from a device according to the first embodiment of the present disclosure.

FIG. 1 is a configuration diagram illustrating an apparatus according to a first embodiment of the present disclosure, and FIG. 2 is a state diagram illustrating a state in which a push of a fixing member with respect to a detection switch is released when the fixing member is separated from the device according to the first embodiment of the present disclosure.

Referring to FIGS. 1 to 2, the apparatus according to the first embodiment of the present disclosure may include a device 20 and a tamper assembly 10 for assembling the device 20 to an entrance wall bracket 30.

Specifically, the device 20 is, e.g., a device capable of collecting fingerprints of a finger in contact with a fingerprint collection surface, and may be protected by a cover. The cover may include a front cover 22 and a back cover 23. In addition, the cover may include a fixing hole 21 passing from an outside of the device 20 to an inside thereof, and may be assembled to the entrance wall bracket 30 through the fixing hole 21.

The entrance wall bracket 30 may be a bracket for installing the device 20 fixed to the entrance wall to install the device 20 on the entrance wall. The entrance wall bracket 30 may include a through hole 31 through which the entrance wall bracket 30 is assembled to the device 20 through a fixing member 100 in a state of matching with the fixing hole 21 of the device 20.

The tamper assembly 10 of the device 20 may include the fixing member 100, a detection switch 200, a tamper unit 300, and an insert 400.

The fixing member 100 may include a fastening means for fixing the device 20 to the entrance wall bracket 30. For example, the fixing member 100 may be a screw bolt that can be rotatably coupled to the through hole 31 of the entrance wall bracket 30 and the fixing hole 21 of the device 20.

The detection switch 200 may include sensor switches that are selectively pushed by the fixing member 100 to detect whether the fixing member 100 is released. As an example, the detection switch 200 may be a tact switch capable of detecting a push operation of the fixing member 100. When the tact switch is pushed in a predetermined distance by a tip portion of the fixing member 100, the tact switch may turn off a tamper function of the tamper unit 300, and when the tact switch is pushed in a predetermined distance or less by the tip portion of the fixing member 100 or is separated from the tip portion of the fixing member 100, the tact switch may turn on the tamper function of the tamper unit 300.

Here, the tamper function can be implemented by generating an alarm signal. The alarm signal may be a visual signal or a sound signal, or may be an electronic signal that other electronic devices or electronic elements can recognize.

Moreover, in the present embodiment, when the tact switch is pushed by the fixing member 100, the tamper function of the tamper unit 300 is turned off, and when the push of the tact switch is released by the fixing member 100, the tamper unit 300 turns on the tamper function. However, by changing programming of the tamper unit 300, various functions may be activated depending on whether the tact switch is pushed or the push thereof is released.

For example, the tact switch may be turned on when pushed by the fixing member 100 and turned off when the push thereof is released by the fixing member 100. In this case, when the tact switch is pushed by the fixing member 100, it is possible to turn on a normal function indicating a stabilization state without abnormality in the security of the device 20, and when the push of the tact switch is released by the fixing member 100, it is possible to turn off the normal function to indicate a state in which an error has occurred in the security of the device 20.

The detection switch 200 may include a terminal 210 that is electrically connected to the tamper unit 300 (for example, a printed circuit board), a button 220 that applies the operation signal by the push of the fixing member 100, and a tamper body 230 that transmits the operation signal of the button 220 to the terminal 210. The button 220 may be disposed in one direction in the tamper body 230 to face the tip portion of the fixing member 100. When the fixing member 100 is pressed by the push, the button 220 may provide the operation signal to the terminal 210.

The terminal 210 of the detection switch 200 may be disposed in a direction perpendicular to the one direction to face the tamper unit 300. One end of the terminal 210 may be electrically connected to the button 220 through the tamper body 230, and the other end of the terminal 210 may be electrically connected to the printed circuit board through soldering.

The terminal 210 may be connected to the tamper body 230 in a direction toward the tamper unit 300. Moreover, the button 220 may be mounted on the tamper body 230 to extend toward the fixing member 100, that is, toward a direction in which the fixing hole 21 of the device 20 is located. The tamper body 230 elastically supports the button 220, and thus, when the push of the fixing member 100 is released, the button 220 can be returned to an original position thereof.

The tamper unit 300 may be housed in the device 20 to be electrically connected to the detection switch 200. The tamper unit 300 may operate a tamper function of the device 20 when the separation of the fingerprint recognition apparatus 20 is detected through the detection switch 200. As an example, the tamper unit 300 may include a printed circuit board (PCB) that operates a pre-programmed tamper function when the separation of the device 20 is detected.

The insert 400 may be mounted in the fixing hole 21 of the device 20. In order to mount the insert 400 in the fixing hole 21 of the device 20, an outer diameter of the insert 400 may have a diameter corresponding to an inner diameter of the fixing hole 21. An inner diameter portion of the insert 400 may be formed with a female thread (not illustrated) to which the tip of the fixing member 100 is rotatably coupled.

Figure 3:
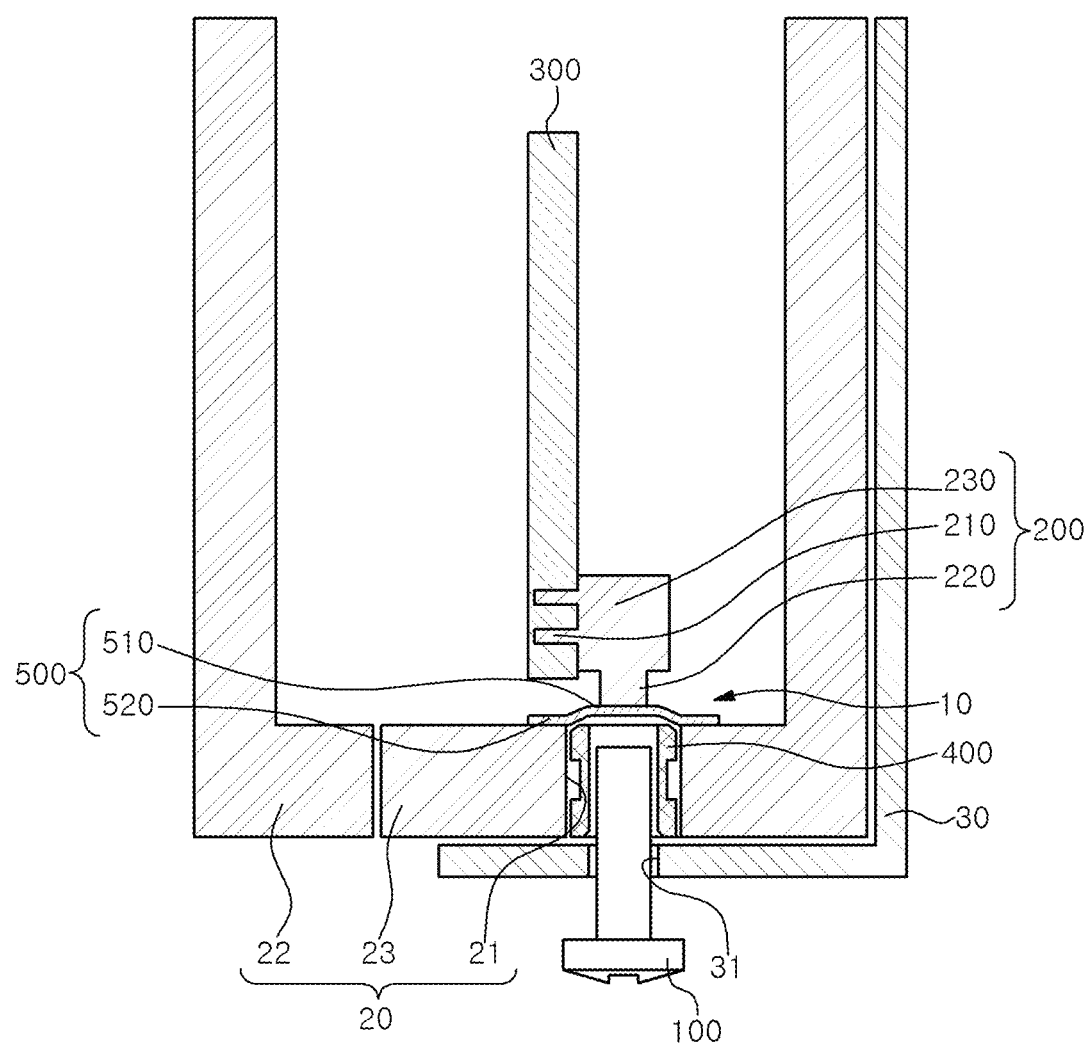
FIG. 3 is a configuration diagram illustrating an apparatus according to a second embodiment of the present disclosure.

FIG. 3 is a configuration diagram illustrating an apparatus according to a second embodiment of the present disclosure.

Referring to FIG. 3, the apparatus according to the second embodiment of the present disclosure may include a device 20 and a tamper assembly 10 for assembling the device 20 to an entrance wall bracket 30. Further, the apparatus according to second embodiment of the present disclosure may include the fixing member 100, the detection switch 200, the tamper unit 300, the insert 400, and a cap sealing member 500. Here, configurations other than the cap sealing member 500, for example, the configurations of the device 20, the tamper assembly 10, the fixing member 100, the detection switch 200, the tamper unit 300, and the insert 400 correspond to the configurations of the device 20, the tamper assembly 10, the fixing member 100, the detection switch 200, the tamper unit 300, and the insert 400 described in the first embodiment, and thus, detailed descriptions thereof will be omitted.

The cap sealing member 500 may be made of a sealing material (for example, silicon, or the like) for watertightness of the device 20. The cap sealing member 500 may be provided between the tip portion of the fixing member 100 coupled to the insert 400 and the detection switch 200 for the watertightness of the device 20.

The cap sealing member 500 may include a cover portion 510 that is positioned to face the fixing hole 21 and a fixing portion 520 that extends outward from the cover portion 510 to be fixed to an edge of the fixing hole 21. The cover portion 510 is formed to be convex in a direction in which the fixing member 100 is inserted into the insert 400, and thus, when the fixing member 100 is pushed, a push force of the fixing member 100 can be smoothly transmitted to the detection switch 200.

Figure 4:
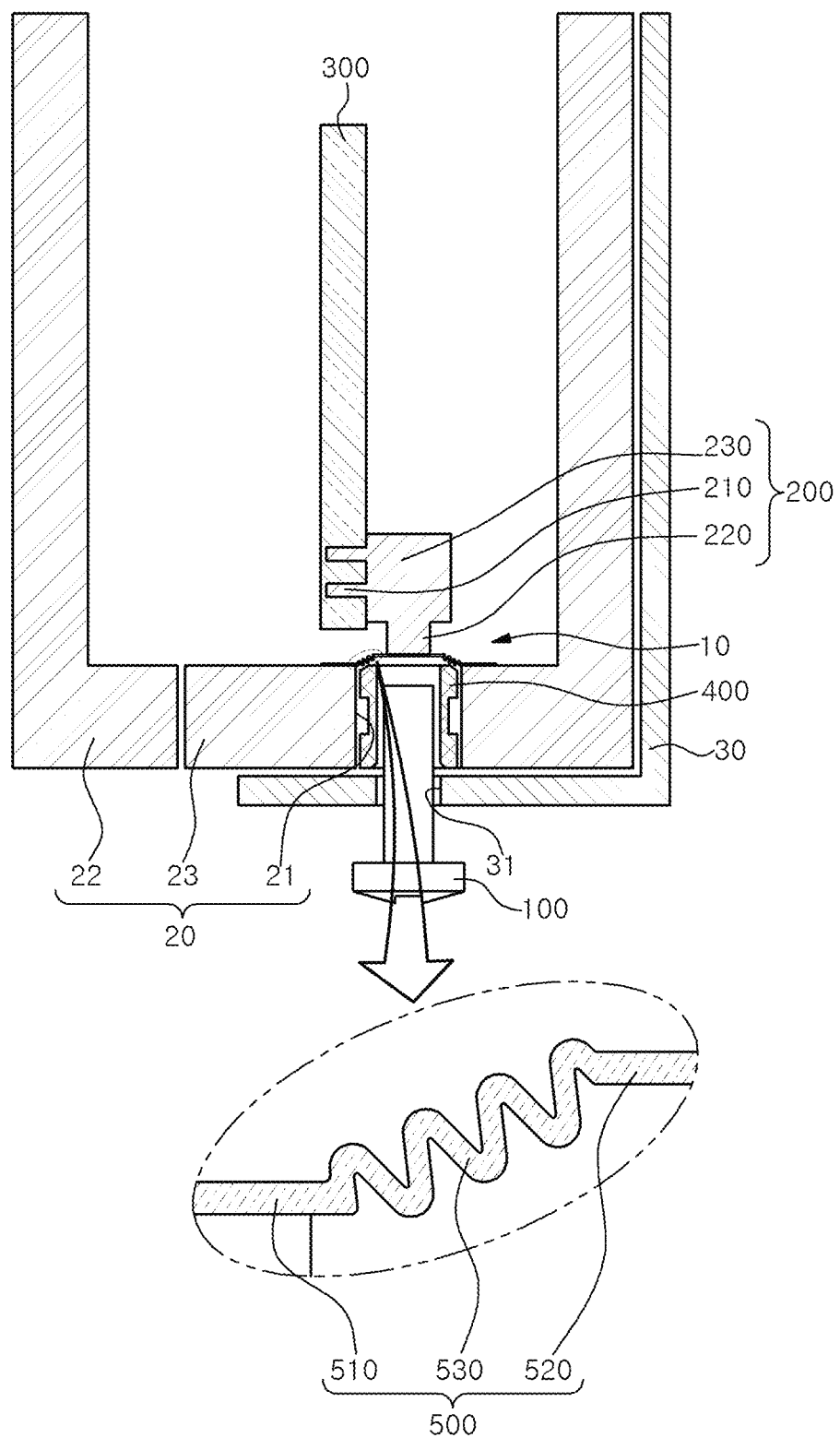
FIG. 4 is a configuration diagram illustrating art apparatus according to a third embodiment of the present disclosure.

FIG. 4 is a configuration diagram illustrating an apparatus according to third embodiment of the present disclosure.

Here, in the third embodiment of the present disclosure, configurations other than the cap sealing member correspond to the configurations described in the second embodiment, and thus, detailed descriptions thereof will be omitted.

Referring to FIG. 4, a cap sealing member 500 may include a cover portion 510 positioned to face the fixing hole 21 and formed convexly in a direction in which the fixing member 100 is inserted, a fixing portion 520 fixed to an edge of the fixing hole 21, and a corrugated portion 530 extended and contracted by the push of the fixing member and disposed between the cover portion 510 and the fixing portion 520 to connect the cover portion 510 and the fixing portion 520.

In this way, in a case where the cover portion 510 and the fixing portion 520 are interconnected through the corrugated portion 530, even when the cap sealing member 500 exists between the fixing member 100 and the detection switch 200, a smooth operation can be transmitted between the fixing member 100 and the detection switch 200 when the fixing member 100 is pushed.

As described above, according to the present disclosure, it is possible to quickly detect separation of the fixing member by an unauthorized outsider through the detection switch that detects the release of the push of the fixing member. Therefore, it is possible to strengthen the tamper operation of the device and prevent falsification of important design information and important data of the device by the unauthorized outsider in advance. Moreover, by disposing the cap sealing member between the tip portion of the fixing member and the detection switch, it is possible to previously prevent a leakage through the fixing hole of the device into which the fixing member is inserted.

As described above, the tamper assembly of the device according to the embodiments of the present disclosure has been described as specific examples, but these are only examples, and the present disclosure is not limited thereto, and should be construed as having the widest scope according to the technical spirit disclosed in the present specification. A person skilled in the art may combine/substitute the disclosed embodiments to implement a pattern of a shape that is not disclosed, but it also does not depart from the scope of the present disclosure. In addition, those skilled in the art can easily change or modify the disclosed embodiments based on the present specification, and it is clear that such changes or modifications also belong to the scope of the present disclosure.

What is claimed is:

1. A device installed on an entrance wall bracket, comprising:
    a fixing member configured to fix the device to the entrance wall bracket;
    a detection switch pushed by the fixing member to detect whether the fixing member is released; and
    a tamper unit operating a tamper function when the release of the fixing member is detected through the detection switch.

2. The device of claim 1, wherein the fixing member has a tip portion, and the device includes a fixing hole,
    wherein the apparatus further includes an insert mounted in the fixing hole through which the tip portion of the fixing member is rotatably coupled.

3. The device of claim 2, further comprising:
    a cap sealing member having elasticity and provided between the tip portion of the fixing member and the detection switch.

4. The device of claim 1, wherein the detection switch includes a tact switch configured to turn off a tamper function of the tamper unit when the tact switch is pushed in a predetermined distance by a tip portion of the fixing member and turn on the tamper function of the tamper unit when the tact switch is pushed in a distance less than the predetermined distance by the tip portion of the fixing member or is separated from the tip portion of the fixing member.

5. The device of claim 4, wherein the detection switch includes:
    a terminal electrically connected to a printed circuit board;
    a button configured to apply an operation signal by the push of the fixing member; and a tamper body configured to transmit the operation signal of the button to the terminal and elastically supporting the button, wherein the button extends from the tamper body in a first direction in which the button faces the tip portion of the fixing member, and the terminal is disposed in a second direction perpendicular to the first direction to face the printed circuit board.

6. The device of claim 3, wherein the cap sealing member includes:
   a cover portion positioned to face the fixing hole and formed convexly in a direction in which the fixing member is inserted; and
   a fixing portion extending outward from the cover portion to be fixed to an edge of the fixing hole.

7. The device of claim 3, wherein the cap sealing member includes:
   a cover portion positioned to face the fixing hole and formed convexly in a direction in which the fixing member is inserted;
   a fixing portion fixed to an edge of the fixing hole; and
   a corrugated portion provided between the cover portion and the fixing portion to connect the cover portion and the fixing portion, wherein the corrugated portion is extended and contracted by the push of the fixing member.

8. The device of claim 1, wherein the tamper unit generates an alarm signal to implement the tamper function.

9. A detection apparatus, comprising:
   an entrance wall bracket having a through hole and configured to be fixedly installed on an entrance wall; and
   a device installed on the entrance wall bracket,
   the device comprising:
   a fixing member configured to fix the device to the entrance wall bracket;
   a detection switch selectively pushed by the fixing member to detect whether the fixing member is released; and
   a tamper unit operating a tamper function when the release of the fixing member is detected through the detection switch.

10. The detection apparatus of claim 9, wherein the device includes a fixing hole to match the through hole when the device is assembled to the entrance wall bracket.

11. The detection apparatus of claim 10, wherein the device is configured to be fastened to the entrance wall bracket by one fixing member.

12. A method of detecting disassembly of an apparatus, comprising:
   providing an apparatus including: an entrance wall bracket having a through hole and configured to be fixedly installed on an entrance wall; and a device installed on the entrance wall bracket;
   detecting whether a fixing member is released using a detection switch pushed by the fixing member; and
   operating a tamper function.

13. The method of claim 12, wherein the detection switch detects that the fixing member is released when the detection switch becomes not to be pushed by the fixing member.

14. The method of claim 12, wherein, in the providing the apparatus, the device includes a fixing hole to match the through hole when the device is assembled to the entrance wall bracket.

15. The method of claim 12, wherein, in the providing the apparatus, the device is fastened to the entrance wall bracket by one fixing member.

* * * * *